(12) United States Patent
Kanno

(10) Patent No.: US 9,792,053 B2
(45) Date of Patent: Oct. 17, 2017

(54) CONTROLLER FOR NONVOLATILE SEMICONDUCTOR MEMORY

(71) Applicant: Kabushiki Kaisha Toshiba, Minato-ku, Tokyo (JP)

(72) Inventor: Shinichi Kanno, Tokyo (JP)

(73) Assignee: Toshiba Memory Corporation, Tokyo (JP)

(*) Notice: Subject to any disclaimer, the term of this patent is extended or adjusted under 35 U.S.C. 154(b) by 242 days.

(21) Appl. No.: 14/833,632

(22) Filed: Aug. 24, 2015

(65) Prior Publication Data

US 2016/0320983 A1   Nov. 3, 2016

Related U.S. Application Data

(60) Provisional application No. 62/155,279, filed on Apr. 30, 2015.

(51) Int. Cl.

| G06F 3/00 | (2006.01) |
|---|---|
| G06F 11/00 | (2006.01) |
| G06F 3/06 | (2006.01) |
| G11C 7/10 | (2006.01) |
| G11C 11/56 | (2006.01) |

(52) U.S. Cl.
CPC .......... *G06F 3/0616* (2013.01); *G06F 3/0661* (2013.01); *G06F 3/0679* (2013.01); *G11C 7/1006* (2013.01); *G11C 11/5642* (2013.01); *G11C 2211/5641* (2013.01)

(58) Field of Classification Search
None
See application file for complete search history.

(56) References Cited

U.S. PATENT DOCUMENTS

| 8,122,323 B2 | 2/2012 | Leung et al. |
| 8,751,911 B2 | 6/2014 | Kanno |
| 2014/0136927 A1 | 5/2014 | Li et al. |

FOREIGN PATENT DOCUMENTS

JP   2011-203878 A   10/2011

*Primary Examiner* — David X Yi
*Assistant Examiner* — Craig Goldschmidt
(74) *Attorney, Agent, or Firm* — David M. Tennant

(57) ABSTRACT

According to one embodiment, a controller for a nonvolatile semiconductor memory that stores data expressed using n levels (n is a natural number not less than 3) page by page includes an extraction unit and a conversion unit. The extraction unit extracts a second data stream shorter than a first data stream from the first data stream that includes a plurality of data written to the nonvolatile semiconductor memory. The conversion unit converts the second data stream into a third data stream longer than the second data stream, when a difference between threshold voltages of the nonvolatile semiconductor memory corresponding to adjacent two data included in the second data stream is a first level difference. The third data stream has a second level difference smaller than the first level difference.

16 Claims, 8 Drawing Sheets

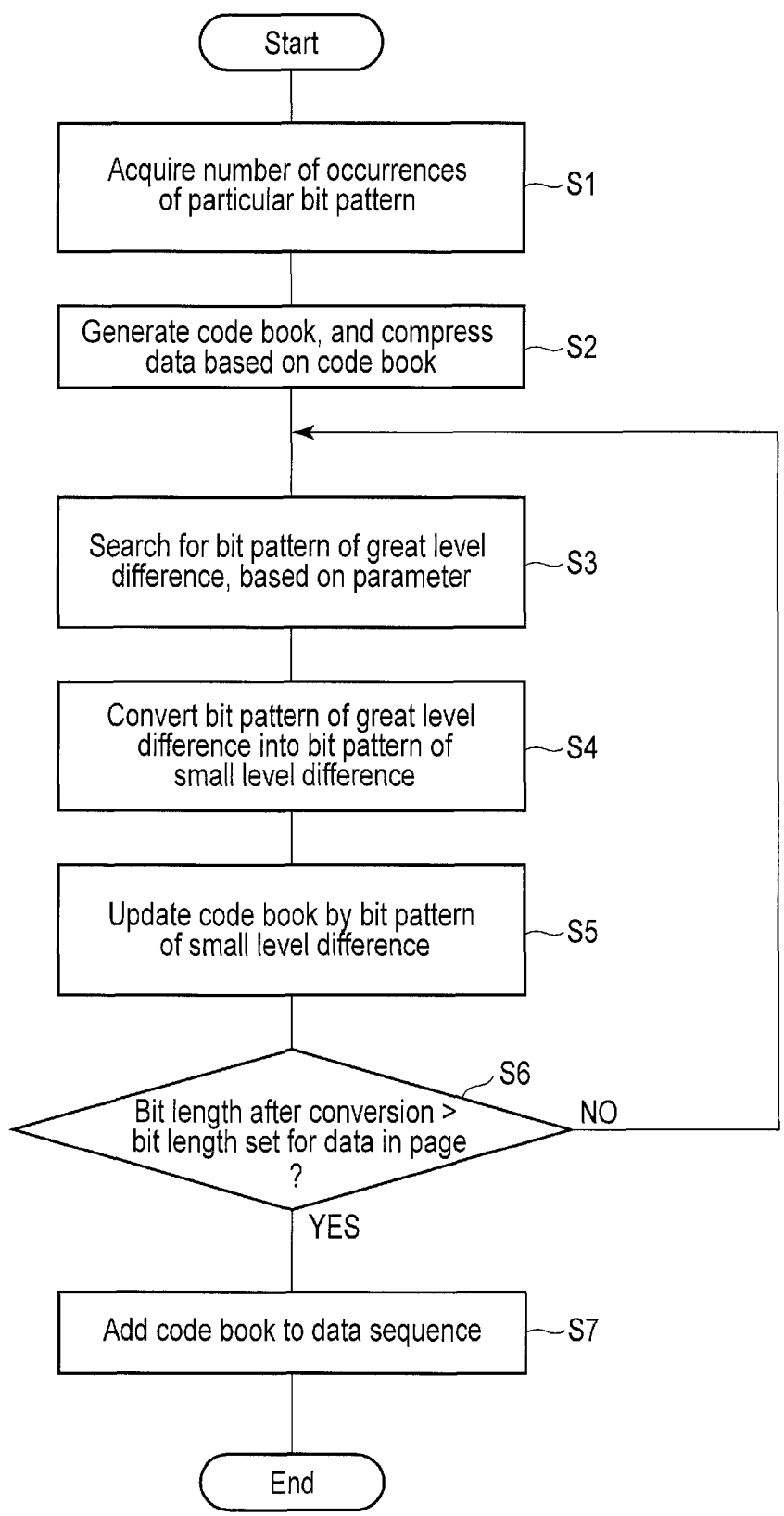
F I G. 8

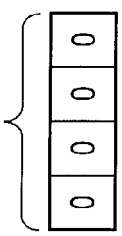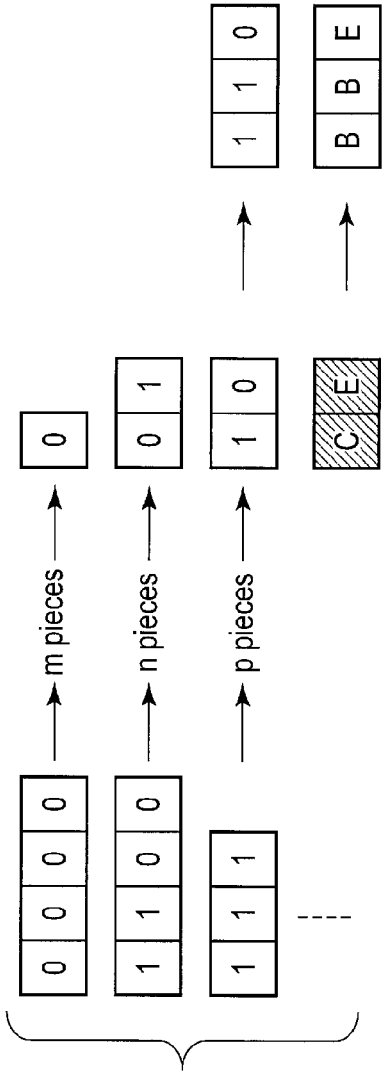

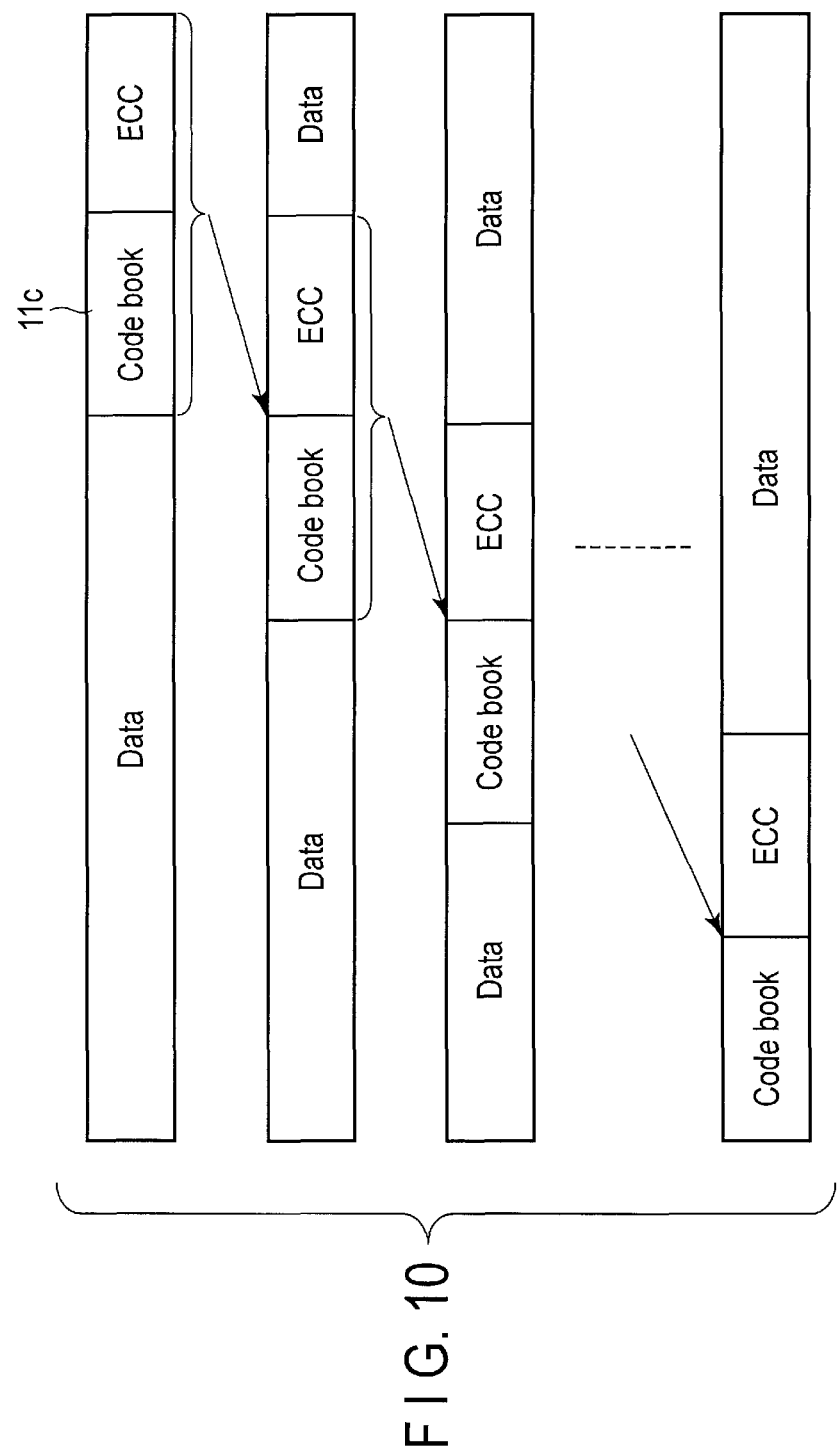
F I G. 10

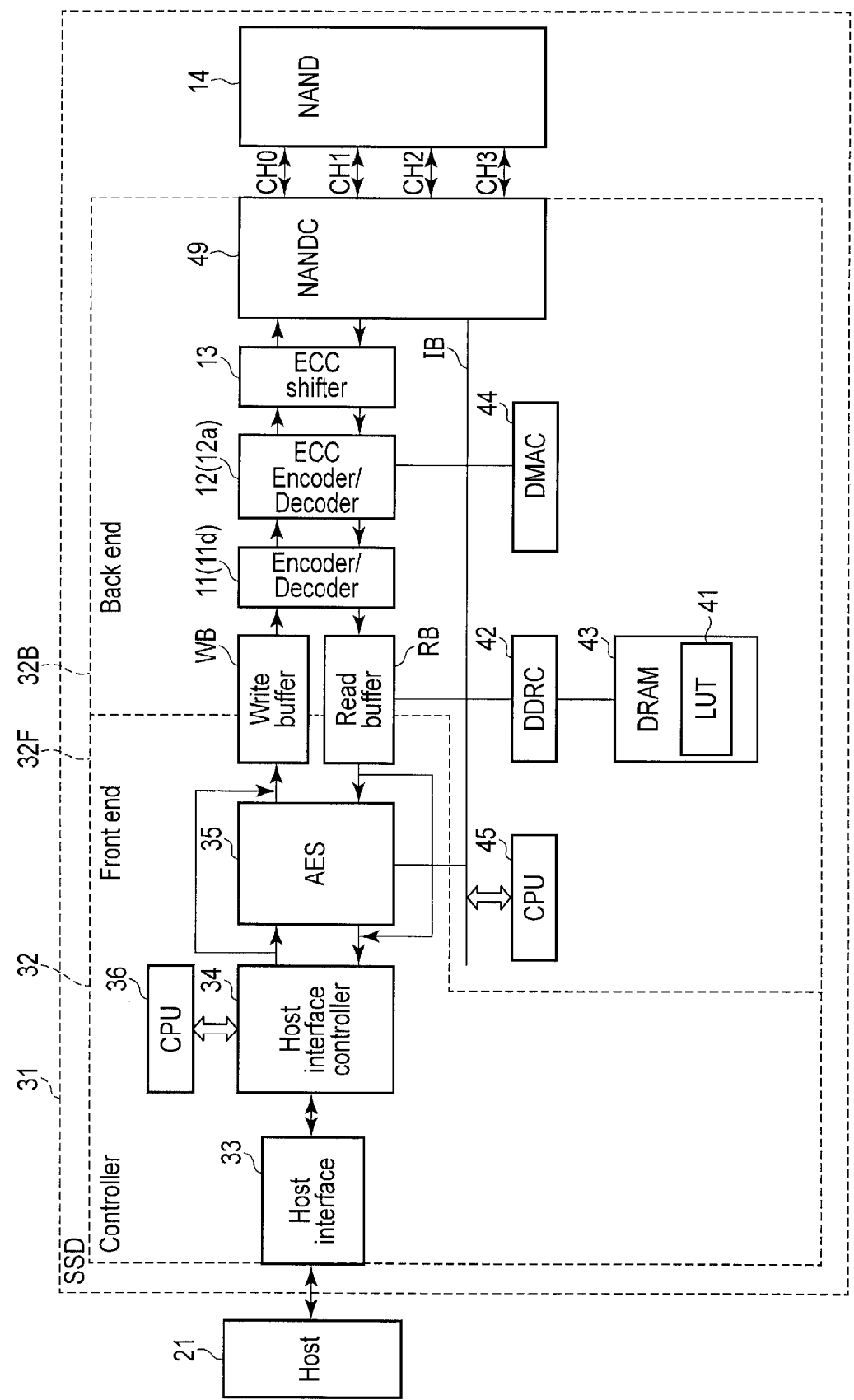
F I G. 14

CONTROLLER FOR NONVOLATILE SEMICONDUCTOR MEMORY

CROSS-REFERENCE TO RELATED APPLICATIONS

This application claims the benefit of U.S. Provisional Application No. 62/155,279, filed Apr. 30, 2015, the entire contents of which are incorporated herein by reference.

FIELD

Embodiments described herein relate generally to a controller for a nonvolatile semiconductor memory.

BACKGROUND

A NAND flash memory as a nonvolatile semiconductor memory can store, for example, multilevel data, using a plurality of threshold voltages for each memory cell. If a high threshold voltage is repeatedly applied to a memory cell, the tunnel oxide film of the memory cell is degraded, thereby shortening the life of the cell. Further, if there are great differences between a plurality of memory cells arranged adjacent to each other along a word line or a bit line, the memory cells having a low threshold voltage vary in threshold voltage, which may cause, for example, program disturbance.

BRIEF DESCRIPTION OF THE DRAWINGS

FIG. 8 is a flowchart showing an operation of the encoder;

FIG. 9A is a view showing an example of input data, FIG. 9B is a view showing operations of the encoder, and FIG. 9C is a view showing an example of a codebook;

FIG. 10 is a schematic view showing an operation of an ECC shifter shown in FIG. 1;

FIG. 14 is a block diagram showing an example of an SSD to which the controller of the embodiment is applied.

DETAILED DESCRIPTION

Figure 1:
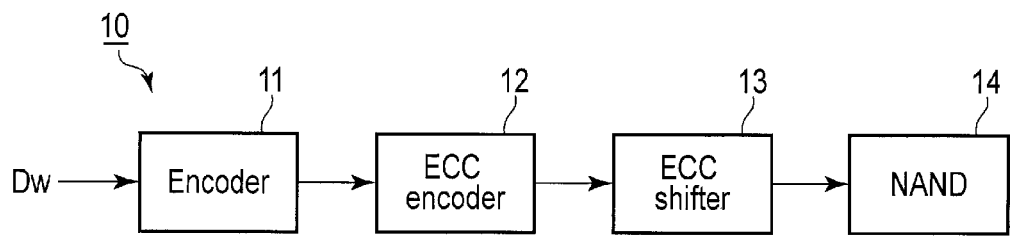
FIG. 1 is a schematic block diagram of an example of a controller according to an embodiment, showing a write system.

In general, according to one embodiment, a controller for a nonvolatile semiconductor memory that stores data expressed using n levels (n is a natural number not less than 3) page by page includes an extraction unit and a conversion unit. The extraction unit extracts a second data stream shorter than a first data stream from the first data stream that includes a plurality of data written to the nonvolatile semiconductor memory. The first data stream has a first length shorter than a length of a page. The conversion unit converts the second data stream into a third data stream longer than the second data stream, when a difference between threshold voltages of the nonvolatile semiconductor memory corresponding to adjacent two data included in the second data stream is a first level difference. The third data stream has a second level difference smaller than the first level difference.

Embodiment

An embodiment will be described with reference to the accompanying drawings. In the drawings, like reference numbers denote like elements.

FIG. 1 schematically shows an example of a controller 10 which controls a NAND flash memory (hereinafter, referred to simply as a NAND) 14 according to the embodiment. FIG. 1 shows only a write system. The controller 10 comprises an encoder 11, an error correction code (ECC) encoder 12, and an ECC shifter 13.

The encoder 11 performs conversion processing of input write data Dw in order to enhance the endurance of the NAND 14 and suppress program disturbance. The ECC encoder 12 adds an ECC to data supplied from the encoder 11. The ECC shifter 13 shifts, within a page, the position of the ECC added to the data, thereby performing so-called wear leveling on the ECC.

The NAND 14 is, for example, a multilevel memory, in which one of a plurality of threshold voltages is stored in one memory cell, using data of two or more bits. The NAND 14 includes a plurality of blocks (not shown), and each of the blocks includes a plurality of pages. In the embodiment, the block is an erase unit. The page is a write unit and includes write data and an ECC.

Figure 2:
FIG. 2 is a schematic view showing an example of a page according to the embodiment.

FIG. 2 shows an example of the page. The length of the page and the length of data (data length or bit length) in the page are constant, and the length (data length or bit length) of an ECC area where the ECC is added is also constant. However, the data length in the page and the data length of the ECC area can be also made variable by managing the data length and the data length of the ECC area. Moreover, the data area in the page includes a code book described later, and the position in which the code book is recorded, and the position of the ECC area are set variable, as will be described later.

Figure 3:
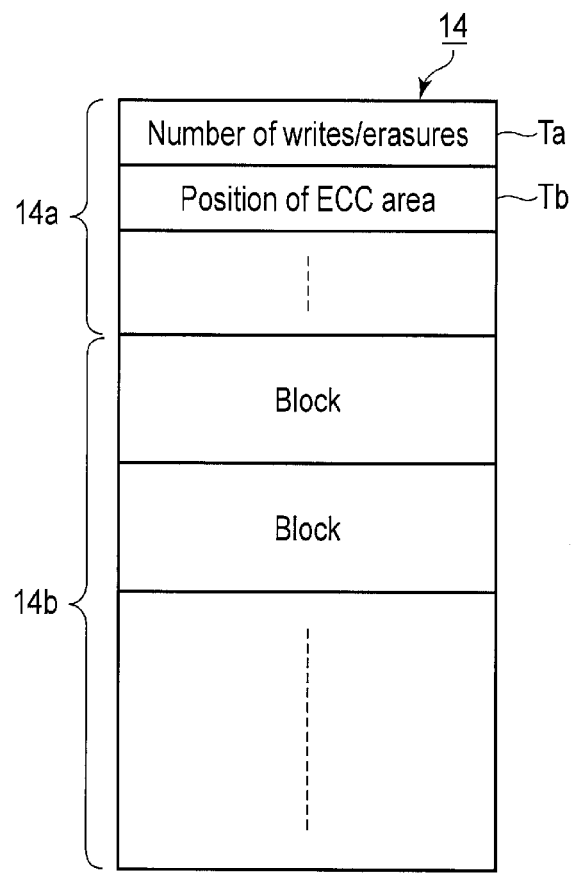
FIG. 3 is a schematic view showing an example of a NAND flash memory according to the embodiment.

FIG. 3 schematically shows an example of the structure of the NAND 14. As shown in FIG. 3, the NAND 14 has a management area 14a and a data area 14b. The management area 14a and data area 14b each have a plurality of blocks as erase units. The data area is an area for storing, for example, user data, and the management area 14a is an area for storing various types of management data associated with the NAND 14. The management area 14a comprises a first table Ta and a second table Tb, etc. The first table Ta is used to manage the number of writes and the number of erases for each block. The first table Ta is updated whenever a write or erase is executed in association with each block. The second table Tb is used to manage the position of the ECC area in the page per, for example, block, as will be described later.

Figure 4:
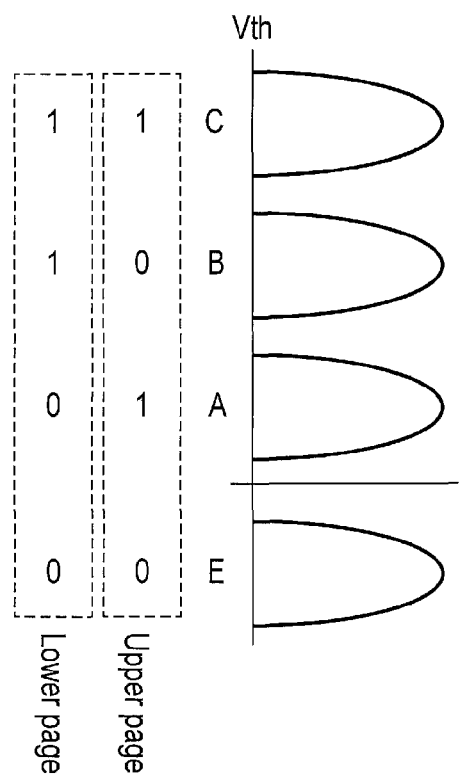
FIG. 4 is a view showing an example of a threshold voltage for the NAND flash memory.

FIG. 4 shows the relationship between a threshold voltage and data in each memory cell of the NAND 14. As shown in FIG. 4, the NAND 14 can store multilevel data, using, for example, a plurality of threshold voltages. Specifically, FIG. 4 shows a threshold voltage distribution of 2 bits and 4 levels, for example. When 2-bit data is stored in a memory cell, threshold voltages having a distribution of "E", "A", "B" and "C" are set, using data of upper and lower pages.

Hereafter, the threshold voltages of "E", "A", "B" and "C" will be also referred to levels "E", "A", "B" and "C", respectively. Level E indicates an erase level, and threshold voltage Vth is set higher in order of "E", "A", "B" and "C". Namely, the level relationship therebetween is "E"<"A"<"B"<"C".

If, for example, level "C", which is highest among the 4 levels, is frequently written to a memory cell, the gate insulating film of the memory cell is degraded to thereby reduce the life of the same. To avoid this, it is necessary to reduce the number of level "C" writes to the memory cell.

Figure 5:
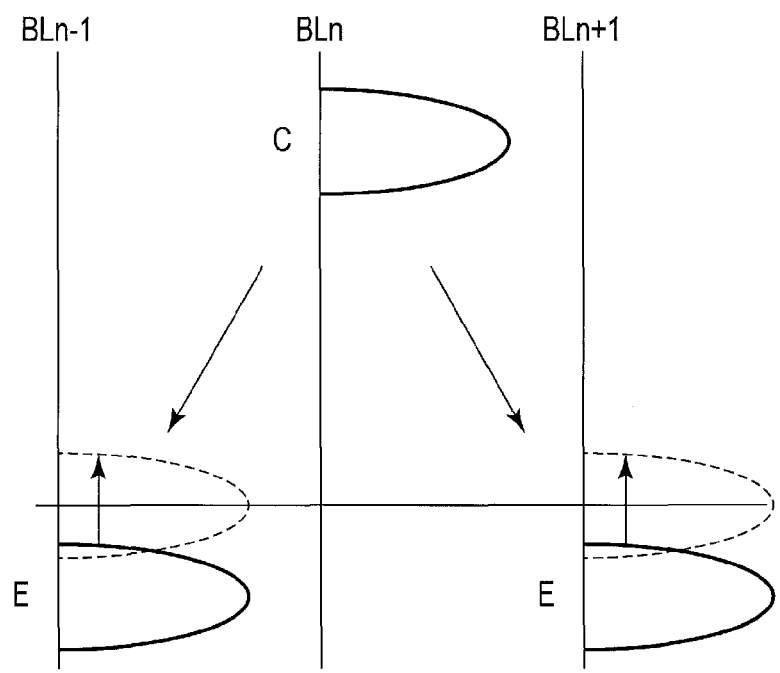
FIG. 5 is a view showing an example of program disturbance in the NAND flash memory.

Further, in the NAND 14, data is simultaneously written to a plurality of memory cells arranged adjacently along a row (along, for example, a word line, not shown). If the levels of data written to a plurality of memory cells arranged adjacently along a row are, for example, "E", "C" and "E", there is a significant difference between level "E" and level "C" as shown in FIG. 5. When data of level "C" having a great level difference to level "E" is written, the threshold voltage of level "E" varies and an error will occur.

This phenomenon will occur also when data of a great level difference is written to a plurality of memory cells arranged along a column (along, for example, a bit line, not shown). Thus, when there is a great level difference between a plurality of memory cells arranged adjacently along the row or column, the lower level (threshold voltage) is raised, with the result that program disturbance occurs.

In order to suppress the program disturbance, it is necessary to reduce the level difference between a plurality of adjacent memory cells. To this end, it is also necessary to suppress level "C" writes of a high threshold voltage.

(Encoder)

Figure 6:
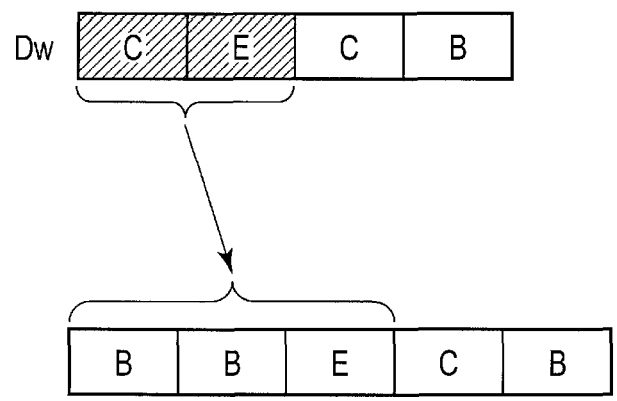
FIG. 6 is a schematic view showing an operation of an encoder shown in FIG. 1.

FIG. 6 schematically shows the operation of the encoder 11 shown in FIG. 1.

In FIG. 6, Dw denotes an example of a data stream including a plurality of data written to a plurality of memory cells arranged adjacently along, for example, a row. The data stream Dw indicates data written to each memory cell as a level set in each memory cell.

As shown in FIG. 6, if a pattern of levels set in memory cells by the data stream Dw is, for example, "C", "E", "C" and "B", the encoder 11 shown in FIG. 1 searches for a pattern of, for example, levels "C" and "E" having a significant difference (threshold voltage difference) from data Dw. If a level pattern of "C" and "E" is found, the encoder 11 converts the level pattern of "C" and "E" into a level pattern that has a smaller level difference than the level pattern of "C" and "E", and does not occur in the data stream Dw. In other words, the encoder 11 replaces a code that exhibits a significant interference between adjacent cells with a code that exhibits a small interference, by extending the first-mentioned code. The code is a code for expressing data using a set of bits "0" and/or "1" constituting the data. A level pattern occurring in the data stream Dw can be used as the code, if a replaced code can be discriminated from other codes.

In the example shown in FIG. 6, the level pattern of "C" and "E" is replaced with, for example, a level pattern of "B", "B" and "E". The encoder 11 repeats such search and conversion processing as the above within the page.

The level pattern of "B", "B" and "E" after conversion has a data length (bit length) longer than the original level pattern of "C" and "E". The encoder 11 repeats the above search and conversion processing, and stops the processing when the data length after conversion is determined to exceed a data length pre-defined in the page. As a result, the data length after conversion does not exceed the pre-defined data length in the page. That is, the conversion process is performed within the pre-defined data length in the page. If the level pattern of "C" and "E" is left in the remaining data in the page after the conversion processing is stopped, the level pattern of "C" and "E" are maintained without being converted. Thus, the embodiment allows slight degradation of the durability of the memory cell, and slight program disturbance.

The above-described search and conversion processing can be also executed on a data pattern written to a plurality of memory cells arranged along a column. In this case, it is sufficient if a buffer capable of holding data corresponding to, for example, one block is provided, and the above-mentioned search is made along the column on the data held by the buffer, thereby executing conversion processing based on the search result.

Figure 7:
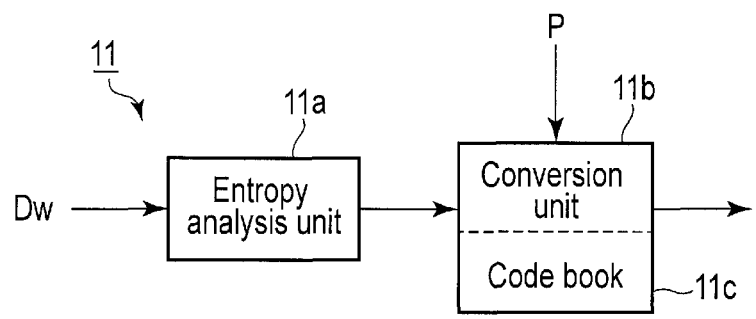
FIG. 7 is a schematic block diagram showing an example of an encoder.

FIG. 7 shows an example of the encoder 11. As shown in FIG. 7, the encoder 11 comprises an entropy analysis unit 11$a$ and a conversion unit 11$b$.

The entropy analysis unit 11$a$ acquires the probability or the number of occurrences of each particular bit pattern included in the bit stream of data Dw input, for example, page by page. Further, the entropy analysis unit 11$a$ arranges, for example, the acquired numbers of occurrences of the bit patterns in a decreasing order.

The conversion unit 11$b$ generates a code book 11$c$ including conversion codes for compressing each bit pattern, based on the analysis result of the entropy analysis unit 11$a$.

Further, the conversion unit 11$b$ converts the analyzed particular bit patterns into codes in accordance with the conversion codes of the code book 11$c$. Furthermore, the conversion unit 11$b$ receives a parameter P set beforehand, for example. The parameter P is used to improve, for example, the endurance and characteristics of the NAND 14, and is, for example, a code indicating a bit pattern of a great level difference. The conversion unit 11$b$ searches the codes converted in accordance with the above-mentioned conversion codes, for a code indicated by the parameter P. When the code indicated by the parameter P is found, it is converted into another code corresponding to a bit pattern of a small level difference. This conversion processing is, for example, extension processing, as will be described later.

Moreover, the conversion unit 11$b$ updates the code book 11$c$ by replacing a code of a great level difference with another code of a small level difference. The updated the code book 11$c$ is added to, for example, the end of a data stream.

FIGS. 8, 9A, 9B and 9C show an operation example of the encoder 11. Referring to FIGS. 8, 9A, 9B and 9C, a further description will be given of the operation of the encoder 11.

The entropy analysis unit 11$a$ acquires the number of occurrences of each particular bit pattern included in the data stream Dw input, for example, page by page (S1). The number of occurrences refers to the number of occurrences of each particular bit pattern included in the data stream Dw.

Specifically, when there is the data stream Dw as shown in FIG. 9A, the number of occurrences of each particular bit pattern, such as "0000", "1100" or "111", is counted. The counted numbers of occurrences are arranged in a decreasing order.

Namely, as shown in FIG. 9B, the numbers of occurrences are counted such that the number of occurrences of "0000"

is m, the number of occurrences of "1100" is n, and the number of occurrences of "111" is p (m>n>p). The numbers of occurrences m, n and p are arranged in the decreasing order. Thus, each bit pattern which does not occur in the data stream Dw is detected by searching for particular bit patterns.

If data stored in a memory cell is expressed using 2 bits and 4 levels, it comprises 2 pages as aforementioned. For this reason, a buffer memory corresponding to, for example, 2 pages is prepared. From a data stream corresponding to the 2 pages in the buffer memory, the number of occurrences of each particular bit pattern is counted, and the resultant numbers of occurrences are arranged in the decreasing order.

Regarding data expressed using 3 bits and 8 levels or more, a buffer memory of 3 pages or more is prepared, and the above-mentioned processing is performed on a data stream of 3 pages or more.

The conversion unit 11b generates the code book 11c including conversion data, such as conversion codes for compressing the bit length of each page, based on the analysis result of the entropy analysis unit 11a, and executes compression processing of the input data stream Dw, based on the code book 11c (S2).

FIG. 9C shows an example of the code book 11c. For instance, the code book 11c includes, as conversion data, the number of occurrences of each particular bit pattern obtained by the entropy analysis unit 11a, and/or the occurrence position of each particular bit pattern, and/or a conversion code generated in accordance with each particular bit pattern. The structure of the code book 11c is not limited to this, but deformable.

The conversion unit 11b compresses the data stream Dw, based on the conversion codes of the code book 11c. More specifically, as shown in FIG. 9B, a bit pattern of "0000", the number of occurrences of which is largest, is converted into a code of, for example, "0", based on the conversion codes. Similarly, a bit pattern of "1100", the number of occurrences of which is next largest, is converted into a code of, for example, "01", and a bit pattern of "111", the number of occurrences of which is next largest, is converted into a code of, for example, "10". Thus, the bit pattern "0000" is compressed from 4 (=4 bits)×m to ¼ m, the bit pattern "1100" is compressed from 4 (=4 bits)×n to ½ n, and the bit pattern "111" is compressed from 3 (=3 bits)×p to ⅔ p.

Further, the conversion unit 11b detects, based on the parameter P, whether the converted codes include a code corresponding to a level pattern of a greatest level difference (S3). If the code corresponding to the level pattern of the greatest level difference is detected, it is converted into a code of a smaller level difference (S4).

More specifically, if the parameter P indicates code "10" corresponding to a level pattern of "C" and "E" that has a greatest level difference, as shown in FIG. 9B, code "10" is searched for in the converted codes. If code "10" is detected, it is converted into a code, such as "110", corresponding to a level pattern of, for example, "B", "B" and "E", which has a smaller level difference than the level pattern of "C" and "E". This code "110" is a code that does not occur in the data stream Dw analyzed in the entropy analysis unit 11a. Thus, the level pattern of "C" and "E" having the greatest level difference in threshold voltage is converted into the level pattern of "B", "B" and "E", which has a smaller level difference. The level pattern of "B", "B" and "E" is further extended than the level pattern of "C" and "E".

The code "10" as a conversion code in the code book 11c is updated to the code "110" corresponding to the level pattern of "B", "B" and "E" having a smaller level difference (S5).

Although in principle, the data stream Dw before conversion is compressed by the above-mentioned conversion processing, the bit length of a level pattern having a greatest level difference in threshold voltage is longer after the conversion than before the conversion.

The conversion unit 11b repeats the above-mentioned search and conversion processing on the data stream Dw (S6 to S3). If the bit length of the converted data exceeds, for example, a bit length preset for data in a page, the conversion unit 11b stops the conversion processing. In other words, the conversion processing is executed within the preset data length in a page.

Subsequently, the generated code book 11c is added to, for example, the end of the data stream in the page S7).

If data stored in a memory cell is expressed using 2 bits and 4 levels, the conversion unit 11b generates data corresponding to, for example, 2 pages by the above-mentioned conversion operation. If data stored in a memory cell is expressed using 3 bits and 8 levels or more, the conversion unit 11b generates data corresponding to, for example, 3 pages or more.

Although in the embodiment, one the parameter P is supplied to the conversion unit 11b, a plurality of the parameters may be set. Namely, in the embodiment, as the parameter P, the code "10" corresponding to the level pattern of "C" and "E" that has the greatest level difference is searched for. However, in addition to this parameter, a code corresponding to a level pattern of "C" and "A" or "B" and "E" may be set as another parameter, be searched for, and be converted into another code of a small level difference.

(ECC Encoder)

The ECC encoder 12 shown in FIG. 1 adds an error correction code (ECC) as data for error correction to a data stream including the code book 11c supplied from the encoder 11, using for example, a system code. The system code includes a Hamming code, a BHC code, a Reed Solomon code, etc. The embodiment employs the Reed Solomon code in which a minimum unit for error correction comprises a plurality of bits. However, the system code is not limited to the Reed Solomon code. In the system code, a data stream is separated from an ECC. Therefore, the content of the data stream including the code book 11c is unchanged, which enables the state of the above-mentioned compressed or decompressed data stream and the content of the code book 11c to be maintained.

(ECC Shifter)

An ECC added to a data stream by the ECC encoder 12 using the system code is not subjected to the above-mentioned conversion processing. Accordingly, the ECC may include data of the level "C", and the occurrence probability of the level "C" data may be high. Because of this, if an area (hereinafter referred to as an ECC area) of a page where the ECC is added is fixed in position in the page, the level "C" data is frequently written to memory cells in the ECC area. Accordingly, it is strongly possible that the memory cells in the ECC area will be further degraded than memory cells to which data is written.

The ECC shifter 13 shown in FIG. 1 shifts the position of the ECC area in the page, based on, for example, the number of accesses to a block, more specifically, the number of, for example, writes and/or erases to/from the block.

As shown in FIG. 3, the number of writes or erases to or from each block of the NAND 14 is managed by the first table Ta. The ECC shifter 13 changes the position of the ECC area in the page when, for example, the number of writes to a target block exceeds a reference value.

That is, the ECC area is provided near, for example, the most significant bit (MSB) in the page at first, as is shown in FIG. 10. Whenever the number of writes to a block as a write target exceeds the reference value, the position of the ECC area in the page is shifted, for example, from the MSB toward a least significant bit (LSB).

The ECC shifter 13 comprises, for example, a shift register, and data in the shift register is circular-shifted from the MSB toward the LSB, based on the number of writes to the block. Namely, data output from the LSB side in accordance with the shift operation is input to the MSB side. Thus, the position of the ECC area in the page is changed. The shift direction and position of the ECC area are not limited to the above. It is sufficient if the position of the ECC area in the page is changed.

Figure 11:
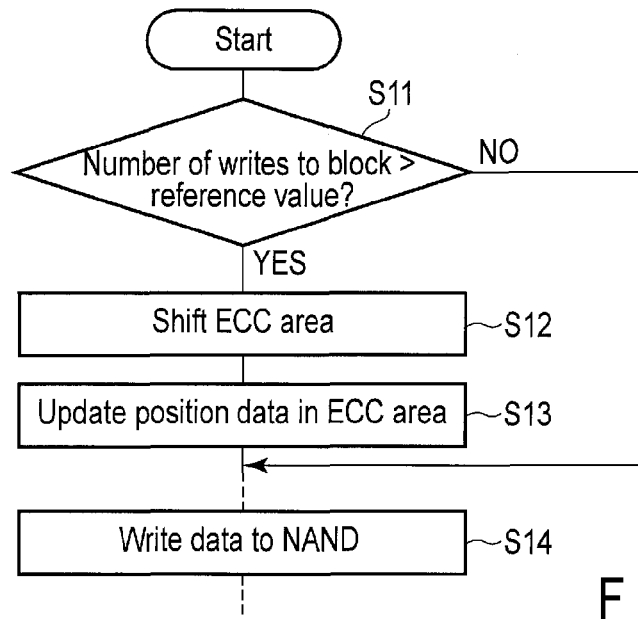
FIG. 11 is a flowchart showing an operation of the ECC shifter.

FIG. 11 shows an operation example of the ECC shifter 13. During writing, the ECC shifter 13 compares, with the reference value, the number of writes to a write target block recorded in the first table Ta (S11). If the comparison result indicates that the number of writes exceeds the reference value, the ECC area is shifted within the page (S12). Subsequently, the second table Tb of the NAND 14 is updated by new ECC-area position data (S13). That is, the position data in the second table Tb on the ECC area corresponding to the write target block is updated. In contrast, if the number of writes does not exceed the reference value, the ECC area is not shifted. Thereafter, the data having its ECC area position in the page adjusted is written to the NAND 14 (S14).

By thus shifting the ECC area position within the page whenever the number of writes to a block exceeds the reference value, degradation of the memory cells in the ECC area can be prevented, thereby increasing the life of the memory cells.

FIG. 10 shows a case where the code book 11*c* in the page is shifted along with the ECC area. Since as described above, the code book 11*c* includes a conversion code for converting the level pattern of "C" and "E" into the level pattern of "B", "B" and "E", it includes the level "C" data. Therefore, if an area (hereinafter, referred to as a code book area) to which the code book 11*c* is added is repeatedly written to the same position in the page, the memory cells will deteriorate as in the case of the ECC area. Namely, if the code book area is shifted along with the ECC area as shown in FIG. 10, degradation of the memory cells can be prevented.

In addition, since the code book area is shifted along with the ECC area, the position of the code book in the page can be relatively determined from the position of the ECC area.

Moreover, in the above description, the position of the ECC area is shifted in accordance with the number of writes to each block stored in the management area of the NAND 14. However, the embodiment is not limited to this. The same advantage can be obtained even when, for example, the positions of the ECC area and the code book area are changed based on the number of erases from a block.

(Data Read)

A read operation will be described. In the read operation, processing opposite to the processing in the above-described write operation will be executed.

Figure 12:
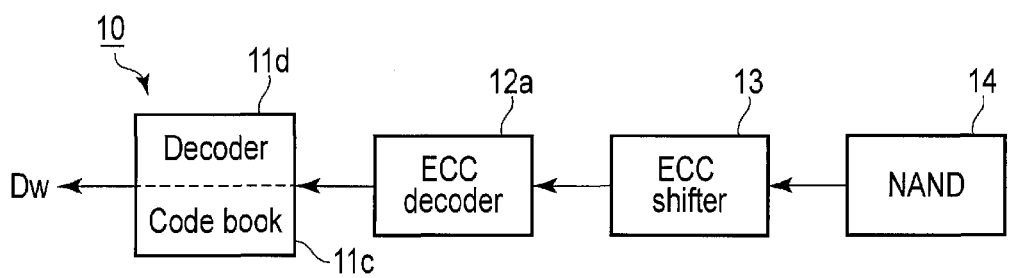
FIG. 12 is a schematic block diagram of another example of the controller according to the embodiment, showing a read system.
Figure 13:
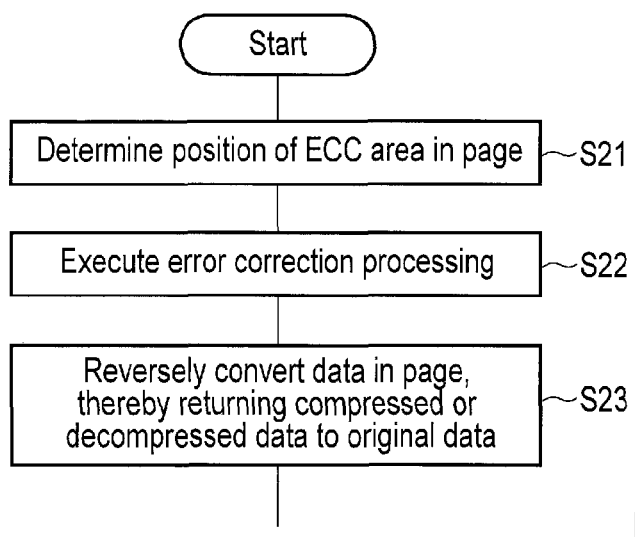
FIG. 13 is a flowchart showing an operation of the controller shown in FIG. 12.

FIG. 12 schematically shows the configuration of a read system, and FIG. 13 shows the operation of the read system. Referring now to FIGS. 12 and 13, the read operation will be described.

One-page data, for example, read from the NAND 14 is supplied to the ECC shifter 13. The ECC shifter 13 determines the position of an ECC area in a page, based on position data of ECC areas corresponding to respective blocks recorded in the second table Tb shown in FIG. 3 (S21). The ECC shifter 13 may return the ECC area to the position shown in, for example, FIG. 2, based on the result of the determination.

An ECC decoder 12*a* performs error correction processing when a data stream includes an error, based on an ECC in the determined ECC area.

A decoder 11*d* reversely converts data in a page, based on the code book 11*c* added to the data in the page, thereby returning compressed or extended data to original data to thereby reproduce write data (S23). Namely, the conversion unit 11*b* converts the compressed or extended data into the original data stream in accordance with the code book 11*c*. As a result, the data stream obtained by a replacement with a level pattern of a small level difference is converted into an original bit pattern of a great level difference. Further, the data compressed based on the number of occurrences of each particular bit pattern is converted into the original bit pattern, and returned to the original position. Thus, the original data stream is reproduced.

(Configuration of SSD)

FIG. 14 shows an example of an SSD 31 to which the embodiment is applied.

In the SSD 31, a controller 32 comprises a front end 32F and a back end 32B.

The front end (host communications unit) 32F comprises a host interface 33, a host interface controller 34, an encryption/decryption unit (Advanced Encryption Standard [AES]) 35, and a CPU 36.

The host interface 33 transmits and receives various commands, LBAs, data, etc., to and from the host 21. The commands include a write command, a read command, an erase command, etc.

The host interface controller 34 controls communication of the host interface 33 under control of the CPU 36.

In a write operation, the AES 35 encrypts write data supplied from the host interface controller 34, and supplies the resultant data to a write buffer WB in the back end 32B. In a read operation, the AES 35 decrypts encrypted read data transmitted from a read buffer RB in the back end 32B. Write and read data can be transmitted without being passed through the AES 35, depending on circumstances.

The CPU 36 controls the host interface 33, the host interface controller 34, and the AES 35 of the front end 32F, thereby controlling the operation of the whole front end 32F.

The back end 32B comprises a write buffer WB, a read buffer RB, a lookup table (LUT) 41, a double-data-rate controller (DDRC) 42, a dynamic random access memory (DRAM) 43, a direct memory access controller (DMAC) 44, a CPU 45, the encoder 11/decoder 11*d*, ECC encoder 12, ECC decoder 12*a* and ECC shifter 13, and a NAND controller (NANDC) 49.

The write buffer WB temporarily stores write data transmitted from the host 21. Specifically, the write buffer WB temporarily stores write data until the write data is accumulated to have a predetermined data size suitable for the NAND 15.

The read buffer RB temporarily stores data read from the NAND 15. Specifically, in the read buffer RB, read data is rearranged in an order suitable for the host 21 (i.e., in the order of logical block addresses (LBA) specified by the host 21.

The LUT 41 is data for converting a logical block address (LBA) into a physical block address (PBA).

The DDRC 42 controls double data rate (DDR) in the DRAM 43. The DRAM 43 is a nonvolatile memory which stores, for example, the LUT 41.

The DMAC 44 transmits write data, read data, etc., via an internal bus IB.

The CPU 45 controls each of the above-mentioned elements (41, 42, 11, 11d, 12, 12a, 13, 49) included in the back end 32B, and controls the whole operation of the back end 32B.

At the time of a write, the encoder 11 analyzes the entropy of a data stream supplied from the write buffer WB as described above, and encodes the data stream, based on the code book 11c, to reduce the level difference between data written to adjacent memory cells. The ECC encoder 12 adds an ECC to a data stream with the code book 11c supplied from the encoder 11, using a system code. The ECC shifter 13 shifts the position of an ECC area in a page, and a code book area, based on, for example, the number of writes to a write target block. Data corresponding to one page and output from the ECC shifter 13 is supplied to the NANDC 49, and is written to the NAND 14 by the NANDC 49.

At the time of a read, data corresponding to one page and output from the NAND 14 is supplied to the ECC shifter 13 via the NAMDC 49. The ECC shifter 13 determines the position of an ECC area in the one page, based on the position data of the ECC area stored in the second table Tb. The ECC decoder 12a performs data-error correction processing based on the determined ECC in the ECC area. The decoder 11d decodes data supplied from the ECC decoder 12a, based on the code book 11c. The data stream reproduced by the decoder 11d is supplied to the read buffer RB.

FIG. 14 shows only one DMAC 44. However, the controller 4 may also contains two or more DMACs 44. The DMAC 44 can be installed in various positions within the controller 32, depending upon circumstances.

The NANDC 49 accesses the NAND 14 in a parallel manner, using a plurality of channels (in the embodiment, four channels CH0 to CH3) in order to satisfy a demand for realizing a predetermined speed.

The configuration of the controller 32 shown in FIG. 14 is just an example, and the embodiment is not limited to this configuration.

Moreover, the SSD 31 is applicable to different types of NAND memories, such as NAND memories of different design rules, a planar NAND and a three-dimensional NAND.

Advantage of Embodiment

According to the above-described embodiment, a data pattern of a great threshold voltage difference included in input data Dw is converted into a data pattern of a small threshold voltage difference. This suppresses the occurrence of program disturbance. Moreover, since in this case, data of a high threshold voltage is reduced, the endurance of each memory cell is enhanced and its life can be increased.

Further, since the program disturbance is suppressed, read errors can be reduced. Accordingly, it is not necessary to use an advanced ECC, and the time required for encoding and decoding the ECC can be reduced.

Furthermore, the positions of the ECC area and the code book area in a page are shifted in accordance with the number of writes or erases to and from a block. Accordingly, the endurance of each memory cell can be enhanced, compared to a case where the positions of the ECC area and the code book area are fixed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A controller for a nonvolatile semiconductor memory that stores data expressed using n threshold voltage levels (n is a natural number not less than 3) page by page, the controller comprising:
an extractor configured to extract a second data stream from a first data stream, the first data stream including a plurality of data written to the nonvolatile semiconductor memory, each of the data having a corresponding threshold voltage level, wherein the second data stream includes compressed data of the first data stream, the first data stream having a first length shorter than a length of a page, and the second data stream being shorter than the first data stream; and
a converter configured to convert the second data stream into a third data stream longer than the second data stream, when a difference between threshold voltages of two adjacent data included in the second data stream is a first threshold voltage level difference, the third data stream including in the place of the two adjacent data of the second data stream a data pattern, wherein each pair of adjacent data within the data pattern has a second threshold voltage level difference smaller than the first threshold level difference.

2. The controller according to claim 1, wherein the conversion unit stops conversion processing when a length of the third data stream exceeds the first length.

3. The controller according to claim 2, wherein the conversion unit generates conversion data used to convert the second data stream into the third data stream.

4. The controller according to claim 3, wherein the conversion unit adds the conversion data to the third data stream.

5. The controller according to claim 2, further comprising an error correction unit configured to add an error correction code to the third data stream with the conversion data added thereto, using a system code.

6. The controller according to claim 5, further comprising a shifter configured to shift, within the page, a position of an area where the error correction code is added, based on number of accesses to a block included in the nonvolatile semiconductor memory.

7. The controller according to claim 6, wherein the shifter shifts, within the page, a position of an area where the conversion data is added and the position of the area where the error correction code is added.

8. The controller according to claim 7, wherein the number of accesses to the block includes one of number of writes to the block and number of the block erasure.

9. The controller according to claim 1, wherein the extraction unit counts a number of occurrences of an at least one commonly occurring pattern of the data of the first data stream.

10. The controller according to claim 9, wherein the conversion unit converts each occurrence of the at least one commonly occurring pattern of the data of the first data stream in the second data stream into a shorter data pattern resulting in a fourth data stream, based on the counted number of the at least one commonly occurring pattern of the data of the first data stream, the fourth data stream being shorter than the second data stream.

11. The controller according to claim 1, wherein the first threshold voltage level difference is a difference between an nth threshold voltage level included in the n threshold voltage levels, and an erasure level, and the second threshold voltage level difference is at least one of a difference between the nth threshold voltage level and a threshold voltage level higher than the erasure level, and a difference between an (n−1)th threshold voltage level included in the n threshold voltage levels, and the erasure level.

12. The controller according to claim 10, wherein the conversion unit generates conversion data used to convert the second data stream into the fourth data stream.

13. The controller according to claim 6, wherein the shifter determines the position of the area where the error correction code is added, based on the number of accesses to the block included in the nonvolatile semiconductor memory, during reading data.

14. The controller according to claim 13, wherein the error correction unit corrects an error in the data, based on the error correction code.

15. The controller according to claim 12, wherein the conversion unit converts the third data stream included in the data into the second data stream, based on the conversion data.

16. A controller for a nonvolatile semiconductor memory that stores data expressed using n threshold voltage levels (n is a natural number not less than 3) page by page, the controller comprising:

an extractor configured to extract a second data stream from a first data stream, the first data stream including a plurality of data written to the nonvolatile semiconductor memory, each of the data having a corresponding threshold voltage level, wherein the second data stream includes compressed data of the first data stream, and the second data stream being shorter than the first data stream; and a converter configured to convert the second data stream into a third data stream longer than the second data stream, when a difference between threshold voltages of two adjacent data included in the second data stream is a first threshold voltage level difference, the third data stream including in the place of the two adjacent data of the second data stream a data pattern, wherein each pair of adjacent data within the data pattern has a second threshold voltage level difference smaller than the first threshold voltage level difference.

* * * * *